United States Patent
Ang et al.

[11] Patent Number: 6,090,691
[45] Date of Patent: Jul. 18, 2000

[54] METHOD FOR FORMING A RAISED SOURCE AND DRAIN WITHOUT USING SELECTIVE EPITAXIAL GROWTH

[75] Inventors: Ting Cheong Ang, Singapore, Singapore; Shyue Fong Quek, Petaling Jaya, Malaysia; Xing Yu, Singapore, Singapore; Ying Keung Leung, Aberdeen, The Hong Kong Special Administrative Region of the People's Republic of China

[73] Assignee: Chartered Semiconductor Manufacturing Ltd., Singapore, Singapore

[21] Appl. No.: 09/439,366

[22] Filed: Nov. 15, 1999

[51] Int. Cl.$^7$ .................................................. H01L 21/22
[52] U.S. Cl. ..................... 438/564; 438/300; 438/199; 438/229; 438/230; 438/303; 438/301
[58] Field of Search ................................. 438/199, 200, 438/221, 229, 230, 279, 299, 300, 301, 303, 530, 542, 564, 595

[56] References Cited

U.S. PATENT DOCUMENTS

| | | | |
|---|---|---|---|
| 5,082,794 | 1/1992 | Pfiester et al. | 437/40 |
| 5,130,272 | 7/1992 | Ferla et al. | 438/301 |
| 5,571,738 | 11/1996 | Krivokapic | 437/44 |
| 5,750,430 | 5/1998 | Son | 438/303 |
| 5,773,358 | 6/1998 | Wu et al. | 438/564 |
| 5,827,768 | 10/1998 | Lin et al. | 438/300 |
| 5,840,604 | 11/1998 | Yoo et al. | 438/230 |
| 5,874,341 | 2/1999 | Gardner et al. | 438/301 |
| 5,899,719 | 5/1999 | Hong | 438/289 |
| 5,915,183 | 6/1999 | Gambino et al. | 438/300 |
| 5,918,134 | 6/1999 | Gardner et al. | 438/305 |
| 5,950,081 | 9/1999 | Chang | 438/227 |
| 6,001,695 | 12/1999 | Wu | 438/289 |
| 6,015,746 | 1/2000 | Yeh et al. | 438/301 |

*Primary Examiner*—Charles Bowers
*Assistant Examiner*—Jack Chen
*Attorney, Agent, or Firm*—George O. Saile; Rosemary L. S. Pike; William J. Stoffel

[57] ABSTRACT

A method for forming a raised source and drain structure without using selective epitaxial silicon growth. A semiconductor substrate is provided having one or more gate areas covered by dielectric structures. Doped polysilicon structures are adjacent to the dielectric structures on each side and are co-planar with the dielectric structures from a CMP process. The first dielectric structures are removed to form gate openings and a liner oxide layer is formed on the bottom and sidewalls of the gate openings. Dielectric spacers are formed on the liner oxide layer over the sidewalls of the gate openings, and the liner oxide layer is removed from the bottom of the gate openings and from over the doped polysilicon structures. Source and drain regions are formed in the semiconductor substrate by diffusing impurity ions from the doped polysilicon layer. A gate oxide layer and a gate polysilicon layer are formed over the semiconductor structure and the gate polysilicon layer is planarized to form a gate electrode. In a key step, the dielectric spacers are removed to form spacer openings, and impurity ions are implanted through the spacer openings and annealed to form source and drain extensions. The dielectric spacers are reformed and a self-aligned silicide layer is formed on the doped polysilicon structure and the gate electrode. Alternatively, the self-aligned silicide layer can be formed prior to removing the dielectric spacers and implanting ions to form source and drain extensions.

30 Claims, 4 Drawing Sheets

METHOD FOR FORMING A RAISED SOURCE AND DRAIN WITHOUT USING SELECTIVE EPITAXIAL GROWTH

BACKGROUND OF INVENTION

1) Field of the Invention

This invention relates generally to fabrication of a semiconductor device and more particularly to a method for forming raised source and drain structures without using selective epitaxial silicon growth (SEG).

2) Description of the Prior Art

As semiconductor dimensions continue to shrink and device densities increase, contact resistance and junction depth become increasingly critical to device performance. Raised source and drain structures can provide shallow junctions with low series resistance, enhancing performance. However, raised source and drain structures are typically fabricated using a selective epitaxial silicon growth (SEG) which has several drawbacks. SEG is an expensive process, and it is difficult to control. SEG generally suffers from spurious growth (on isolation structures and layers), incomplete growth (particularly on contaminated surfaces) and faceting.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,899,719 (Hong) shows a method for forming a raised source and drain without SEG by patterning a gate opening in a polysilicon layer doped with impurity ions of as first type, forming source and drain junctions under the polysilicon layer by diffusion, forming dielectric spacers at the edges of the gate opening, and depositing a second polysilicon layer to form a gate electrode. Lightly doped source and drain regions (LDD's) are formed by implanting impurity ions of the first type through the gate opening prior to forming the spacers, then counter-doping the channel region after forming the spacers using impurity ions of a second type opposite the first type. In one embodiment of this invention, the dielectric spacers are removed after the gate electrode is formed, and a halo implant is performed having a conductivity opposite from the source and drain junctions to reduce the size of the junctions, and the spacers are reformed by a second dielectric deposition. However, this invention does not show or suggest forming source and drain extensions (LDD) by implanting through an opening created by removing dielectric spacers adjacent the gate electrode. Nor does this invention show or suggest that it can be used with a self-aligned silicide process, whose rapid thermal anneal step would further difuse the source and drain extensions. Also, this invention does not show or suggest the use of a liner oxide layer.

U.S. Pat. No. 5,915,183 (Gambino et al.) shows a raised source and drain junction process using CMP and a recess etch of a blanket polysilicon layer.

U.S. Pat. No. 5,571,738 (Krivokapic) shows a polysilicon LDD and a self-aligned channel transistor.

U.S. Pat. No. 5,082,794 (Pfiester et al.) teaches selective polysilicon deposition for a transistor.

U.S. Pat. No. 5,827,768 (Lin et al.) shows a planarized and raised source and drain structure.

SUMMARY OF THE INVENTION

It is an object of the present invention to provide a method for forming raised source and drain structures without using selective epitaxial silicon growth (SEG).

It is another object of the present invention to provide a method for forming raised source and drain structures with shallow source and drain extensions with easily controllable depths.

It is another object of the present invention to provide a method for forming raised source and drain structures with good co-planarity of the source and drain structures with the adjacent gate.

It is another object of the present invention to provide a method for forming raised source and drain structures with L-shaped spacers at the sidewalls of the raised source and drain.

It is yet another object of the present invention to provide a method for forming raised source and drain junctions with very low series resistance, using a self-aligned silicide process.

To accomplish the above objectives, the present invention provides a method for forming raised source and drain structures by implanting impurity ions for source and drain extensions (LDDs) through an opening created by removing dielectric spacers adjacent to the gate electrode, combined with a self-aligned silicide process.

The process begins by providing a semiconductor substrate having one or more gate areas covered by dielectric structures. Doped polysilicon structures are adjacent to the dielectric structures on each side and are co-planar with the dielectric structures from a CMP process. The first dielectric structures are removed to form gate openings and a liner oxide layer is formed on the bottom and sidewalls of the gate openings. Dielectric spacers are formed on the liner oxide layer over the sidewalls of the gate openings, and the liner oxide layer is removed from the bottom of the gate openings and from over the doped polysilicon structures. Source and drain regions are formed in the semiconductor substrate by diffusing impurity ions from the doped polysilicon layer. A gate oxide layer and a gate polysilicon layer are formed over the semiconductor structure and the gate polysilicon layer is planarized to form a gate electrode. In a key step, the dielectric spacers are removed to form spacer openings, and impurity ions are implanted through the spacer openings and annealed to form source and drain extensions. The dielectric spacers are reformed and a self-aligned silicide layer is formed on the doped polysilicon structure and the gate electrode. Alternatively, the self-aligned silicide layer can be formed prior to removing the dielectric spacers and implanting ions to form source and drain extensions.

The present invention provides considerable improvement over the prior art. One key advantage of the present invention are that raised source and drain structures can be formed without using a SEG process, providing a more economical process. The present invention provides good control of the junction depth by implanting source and drain extensions through the spacer openings, while the liner oxide layer reduces impurity diffusion from the doped polysilicon structures. Also, the raised source and drain structures of the present invention are compatible with a self-aligned silicide process providing low contact resistance, and the use of CMP provides good co-planarity of the raised source and drain structures with the gate electrodes.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming raised source and drain structures without using SEG.

First Preferred Embodiment of the Present Invention—FIGS. 1–9

Figure 1:
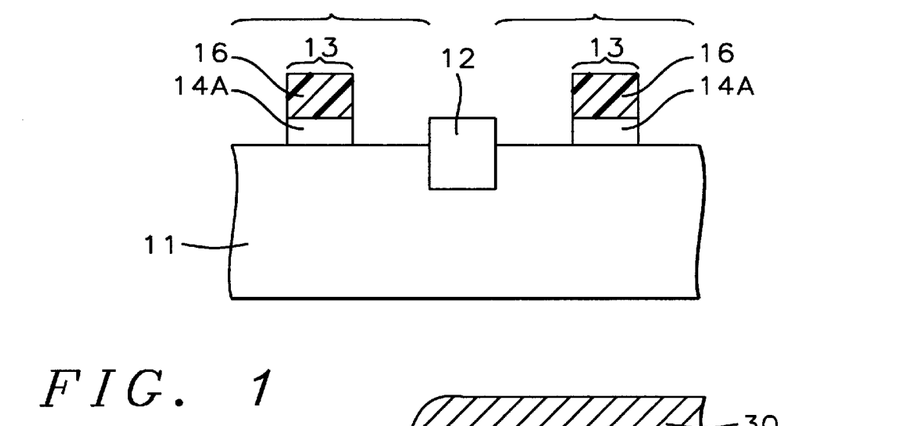
FIGS. 1 through 9 illustrate sequential sectional views of a process for forming raised source and drain structures without using selective epitaxial silicon growth according to the inventors' current process.

The first preferred embodiment of the present invention begins by providing a semiconductor substrate (11). Semiconductor substrate (11) is understood to include any of a number of substrate structures known in the art, including but not limited to: a wafer of semiconducting material such as monocrystalline silicon or germanium, a polysilicon structure, or a silicon-on-insulator (SOI) structure.

Referring to FIG. 1, the semiconductor substrate (11) has a first area (1) wherein either the semiconductor substrate (11) or a well formed therein has a first carrier type (e.g. N-type or P-type). The first area (1) includes a gate area (13) where a transistor gate will be formed. The gate in the first area will be for a second type (e.g. either an N-type or a P-type) transistor, where the second type is opposite the first type. Optionally, the semiconductor substrate (11) can further include a second area (2) having a substrate or well of the second type with a gate area (13) where a gate for a first type transistor is formed, as in a CMOS device.

Still referring to FIG. 1, a dielectric layer (14) is formed over the first area (1) and the second area (2). The dielectric layer (14) is preferably composed of silicon dioxide having a thickness of between about 1500 Angstroms and 3000 Angstroms. The first area (1) and the second area (2) are preferably defined and separated by an isolation structure (12) whose top surface is co-planer with the top surface of the dielectric layer.

Still referring to FIG. 1, the dielectric layer (14) is patterned to form dielectric structures (14A) which only overlie the gate areas (13) of said semiconductor substrate (11). The dielectric layer (14) can be patterned using photolithography (e.g. deposit photoresist, expose photoresist through a pattern, develop photoresist, etch, and remove photoresist).

Figure 2:
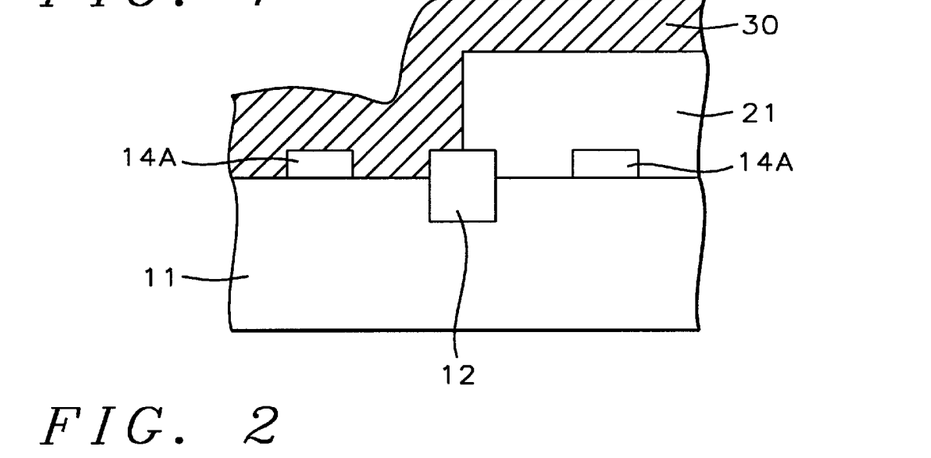

Referring to FIG. 2, a first doped polysilicon layer (30) is formed over the dielectric structures (14A) and the semiconductor substrate (11) in the first area (1). For a device having a second area (2) of opposite type from the first area, a first nitride mask (21) is formed over the second area (2) prior to forming the first doped polysilicon layer (30). For example, the first doped polysilicon layer (30) can be an N-doped polysilicon layer, as shown in FIG. 2, formed to a thickness of between about 3000 Angstroms and 5000 Angstroms, and doped in-situ using phosphine ($PH_3$) to provide a concentration of P ions of between about 1E15 atm/$cm^3$ and 5E15 atm/$cm^3$, or arsine ($AsH_3$) to provide a concentration of As ions of between about 1E15 atm/$cm^3$ and 5E15 atm/$cm^3$.

The first doped polysilicon layer (30) is then planarized using a chemical-mechanical polishing (CMP) process to form first doped polysilicon structures (30A). The dielectric structures (14A) in the first area (1) are preferably used as a CMP stop, resulting in first doped polysilicon structures (30A) whose top surfaces are co-planer with the top surfaces of the dielectric structures (14A).

Figure 3:
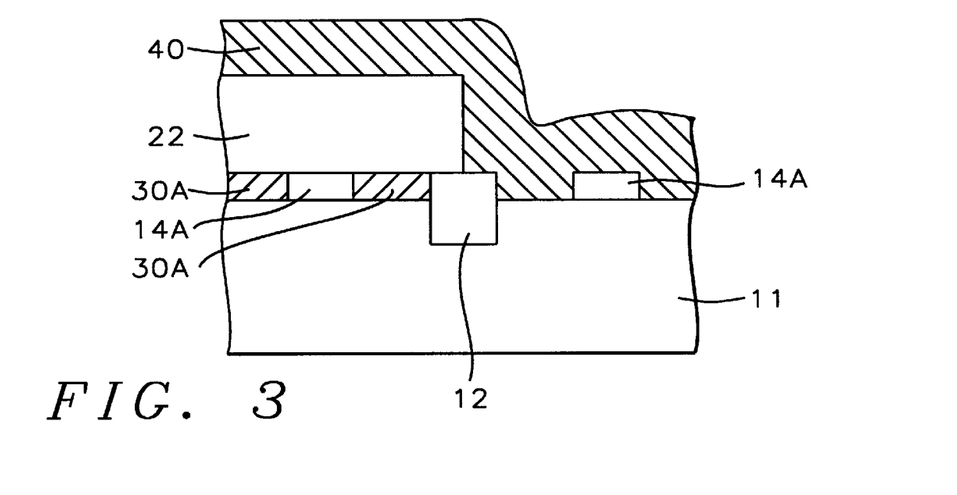

Referring to FIG. 3, for devices having a first area (1) and a second area (2) of opposite carrier types, the first nitride mask (21 in FIG. 2) is removed and a second nitride mask (22) is formed over the first area (1). The first nitride mask is preferably removed using an etch selective to the dielectric structures (14A). For example, the nitride mask could be removed using a reactive ion etch with $CHF_3/O_2$, $CH_2F_2$, or $CH_3F$ or using hot phosphoric acid in a wet etch or strip, for dielectric structures composed of silicon dioxide.

Still referring to FIG. 3, a second doped polysilicon layer (40) is formed over the dielectric structures (14A) and the semiconductor substrate (11). For example, the second doped polysilicon layer (40) is composed of P-doped polysilicon when the first doped polysilicon layer (30) is composed of N-doped polysilicon. The second doped polysilicon layer (40) can be formed to a thickness of between about 3000 Angstroms and 5000 Angstroms, and doped in-situ using diboroane ($B_2H_6$) to provide a concentration of B ions of between about 1E15 atm/$cm^3$ and 5E15 atm/$cm^3$.

Figure 4:
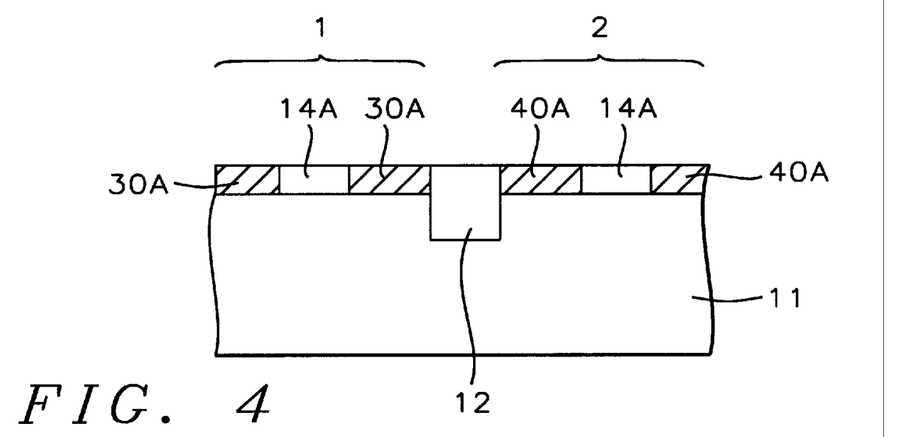

The second doped polysilicon layer (40) is then planarized using a chemical-mechanical polishing (CMP) process to form second doped polysilicon structures (40A). The dielectric structures (14A) in the second area (2) are preferably used as a CMP stop, resulting in second doped polysilicon structures (40A) whose top surfaces are co-planer with the top surfaces of the dielectric structures (14A). The second nitride mask (22) is removed, as shown in FIG. 4.

Figure 5:
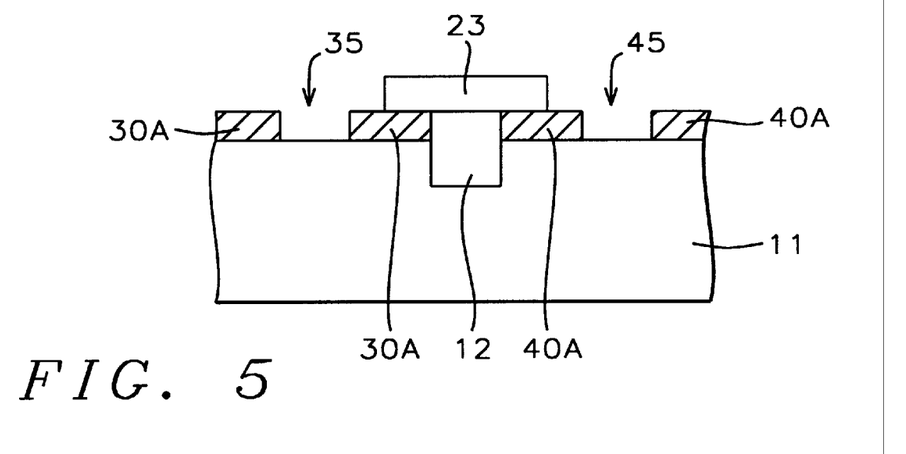

Referring to FIG. 5, a third nitride mask (23) is formed over the isolation structure (12), and the dielectric structures (14A) are removed to form gate openings (45) having a bottom comprising the semiconductor substrate (11) and sidewalls comprising the first doped polysilicon structures (30A) in the first area (1) and the second doped polysilicon structures (40A) in the second area (2). The dielectric structures (14A) are preferably removed using an etch selective to polysilicon. For example, dielectric structures composed of silicon dioxide can be etched using a reactive ion etch with a $CHF_3/CHF_4$ chemistry.

Figure 6:
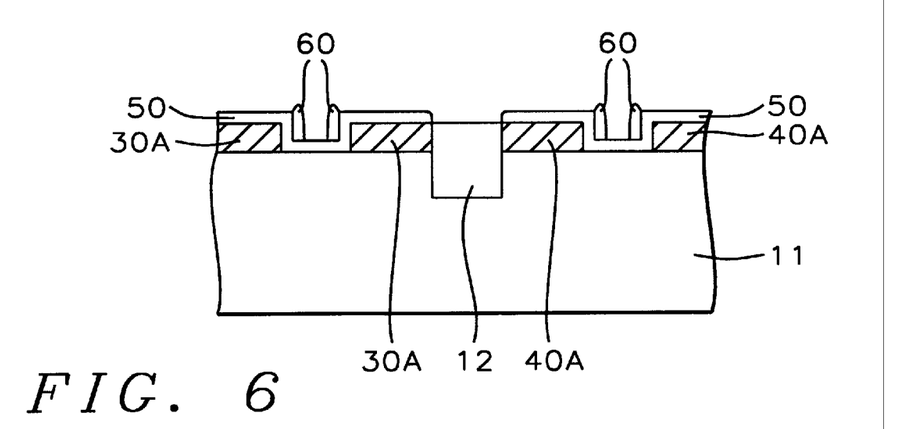

Referring to FIG. 6, a liner oxide layer (50) is formed on the bottom and sidewalls of the gate openings (45). The liner oxide layer (50) can be thermally grown to a thickness of between about 100 Angstroms and 500 Angstroms, preferably about 200 Angstroms.

Still referring to FIG. 6, dielectric spacers (60) are formed on the liner oxide layer (50) over the sidewalls of the gate openings (45). The dielectric spacers (60) are preferably composed of silicon nitride or silicon oxynitride. They can be formed by depositing a dielectric layer over the liner oxide layer (50) and anisotropically etching the dielectric layer leaving dielectric spacers (60) where steps occur in the topography of the liner oxide layer (50) (e.g. the sidewalls of the gate opening (45)).

Figure 7:
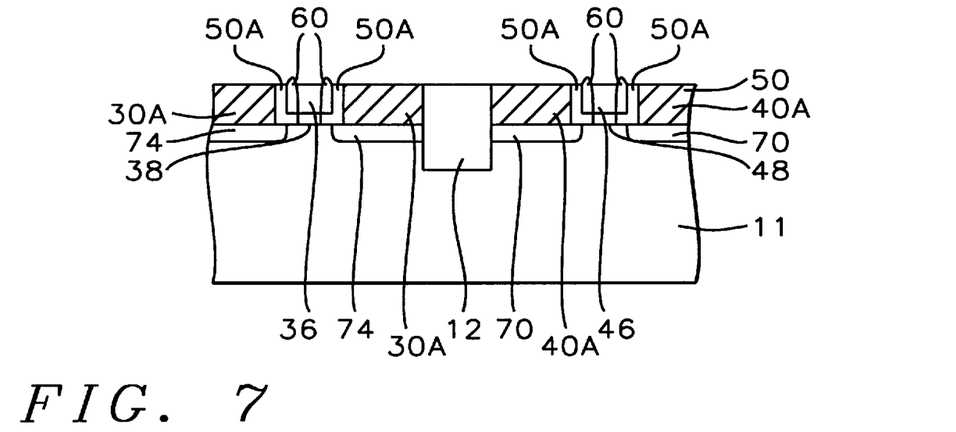

Referring to FIG. 7, the exposed portions of the liner oxide layer (50) are removed from the bottom of the gate openings (45) and from over the first doped polysilicon structure (30A) and the second doped polysilicon structure (40A). The exposed portions of the liner oxide layer are preferably removed using an etch selective to the dielectric spacers (60). For example, for dielectric spacers (60) composed of silicon nitride, the liner oxide layer can be etched selective to the dielectric spacers (60) using a wet etch with HF. The remaining portions of the liner oxide layer form L-shaped spacers (50A) on the sidewalls of the first and second doped polysilicon structures (30A, 40A).

Still referring to FIG. 7, gate oxide layers (38, 48) are formed on the semiconductor substrate (11) in the gate openings (45). The gate oxide layers (38,48) are preferably thermally grown to a thickness of between about 10 Angstroms and 200 Angstroms, preferably about 30 Angstroms.

A polysilicon layer is formed over the gate oxide layers and planarized to form a first gate electrode (36) in the first area (1) and a second gate electrode (46) in the second area (2). The polysilicon layer is preferably formed to a sufficient thickness to completely fill the gate openings (45), and planarized using a CMP process with the dielectric spacers (60) acting as a CMP stop.

As shown in FIG. 7, source and drain regions (70) are formed in the first area (1) by diffusing impurity ions from the first doped polysilicon structure (30A) and source and drain regions (74) are formed in the second area (2) by diffusing impurity ions from the second doped polysilicon structure (40A) into the semiconductor substrate (11). The source and drain regions (70, 74) are preferably formed by annealing the semiconductor substrate (11) at a temperature of between about 800° C. and 1150° C. for a time of between about 5 seconds and 60 seconds.

Figure 8:
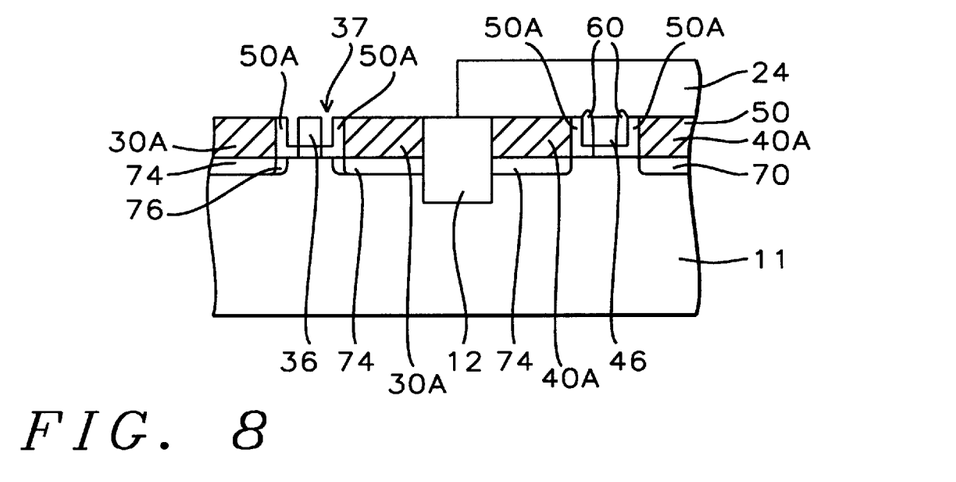

Referring to FIG. 8, the dielectric spacers (60) in the first area (1) are removed to form spacer openings (37). For devices such as CMOS, having a first area (1) and a second area (2) with opposite carrier types, a first implant mask (24) can be formed over the second area (2) prior to removing the dielectric spacers (60). The dielectric spacers (60) are preferably removed using an etch selective to the gate electrode (36) and the liner oxide layer (50). For example, dielectric spacers composed of silicon nitride can be removed using a reactive ion etch with $CHF_3/O_2$, $CH_2F_2$, or $CH_3F$, or using hot phosphoric acid to strip away the silicon nitride.

In a key step, ions of a second conductivity type are implanted into the semiconductor substrate (11) in the first area (1) through the spacer openings (37) to form source and drain extensions (76). For a P-type transistor, the source and drain extensions (76) can be formed by implanting B or $BF_2$ ions at an energy of between about 3 KeV and 150 KeV and at a dose of between about 5E13 atm/cm$^2$ and 1E15 atm/cm$^2$. The impurity ions are then driven in at a temperature of between about 800° C. and 1150° C.

Figure 9:
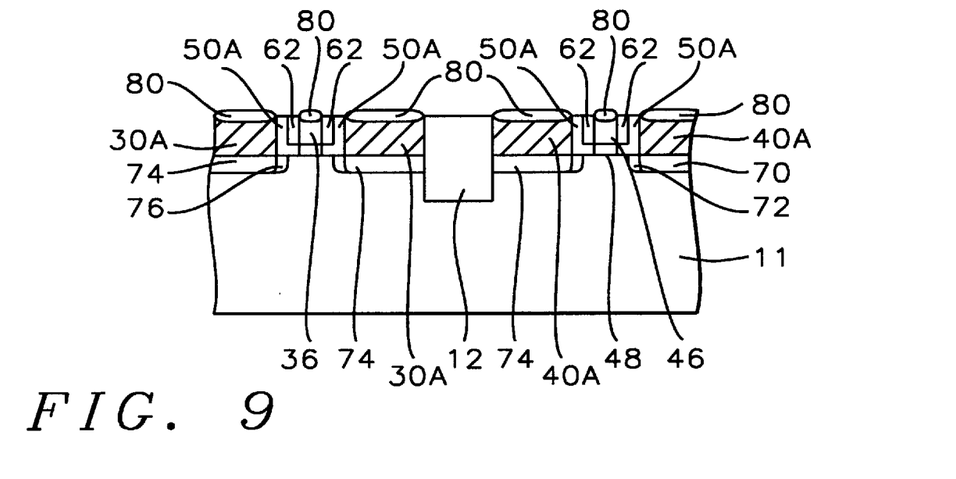

Referring to FIG. 9, dielectric spacers (60) are reformed in the spacer openings (37) in the first area (1) by forming a second spacer dielectric layer over the semiconductor substrate (11), and planarizing the second spacer dielectric layer using a CMP process stopping on the first doped polysilicon structure (30A) and on the first gate electrode (36). The first implant mask (not shown) is then removed.

For devices having a first area (1) and a second area (2) with opposite carrier types, a second implant mask (not shown) can be formed over the first area (1) and the dielectric spacers (60) can be removed in the second area (2) using the method described hereabove. Source and drain extensions (72) can be formed in the second area (2) by implanting phosphorous or arsenic ions. Phosphorous ions are implanted at an energy of between about 3 KeV and 150 KeV and at a dose of between about 5E13 atm/cm$^2$ and 1E15 atm/cm$^2$. The impurity ions in the second area (2) can be driven in by annealing at a temperature of between about 800° C. and 1150° C. Dielectric spacers can be reformed in the spacer openings in the second area by depositing a dielectric layer and planarizing using a CMP process.

Still referring to FIG. 9, a self-aligned silicide layer (80) is formed on the first doped polysilicon structure (30A), the second doped polysilicon structure (40A), and the gate electrodes (36, 46). In the first embodiment, the self aligned silicide layer (80) is composed of cobalt silicide (CoSi) so that the source and drain extensions (72,76) are not damaged by the anneal step. A layer of cobalt is deposited over the semiconductor substrate (11). The cobalt is then caused to react with the first doped polysilicon structure (30A), the second doped polysilicon structure (40A), and the gate electrodes (36, 46), by annealing at a temperature of between about 700° C. and 1150° C., and the unreacted cobalt is removed.

Second Preferred Embodiment—FIGS. 1–7, 10 & 11

The second preferred embodiment proceeds the same as the first preferred embodiment through formation of the source and drain regions (70, 74) as shown in FIG. 7.

Figure 10:
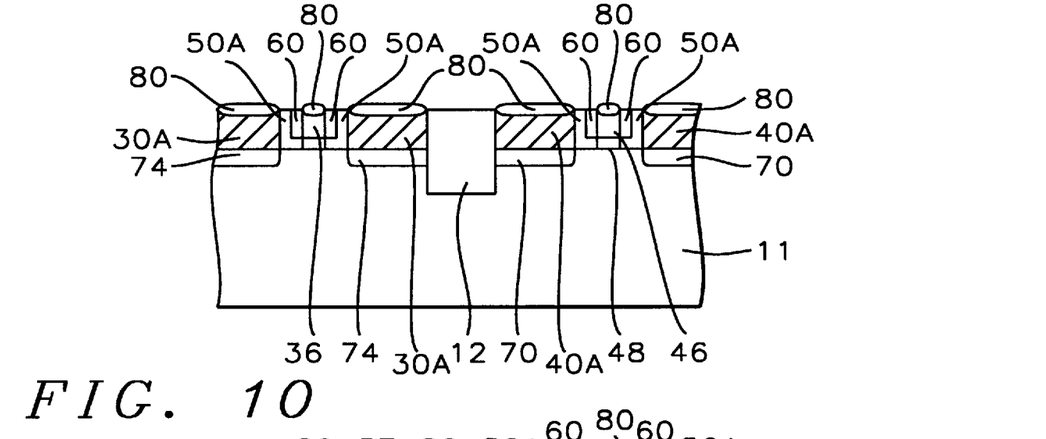
FIGS. 10 through 12 illustrate sequential sectional views of an alternate process for forming raised source and drain structures without using selective epitaxial silicon growth according to the inventors' current process.

Referring to FIG. 10, a self-aligned silicide layer (80) is formed on the first doped polysilicon structures (30A), the second doped polysilicon structures (40A) and the gate electrodes (36, 46). For the second embodiment, the self-aligned silicide layer can be composed of various silicide layers including, but not limited to titanium silicide, tungsten silicide, cobalt silicide, and tantalum silicide. This is because the source and drain extensions (72, 76) are not exposed to the anneal step of the self-aligned silicide process. The self aligned silicide layer (80) can be formed by depositing a metal layer, such as titanium over the semiconductor substrate (11) and causing the metal layer to react with the first doped polysilicon structures (30A), the second doped polysilicon structures (40A), and the gate electrodes (36, 46) by annealing at a temperature of between about 700° C. and 1150° C.

Figure 11:
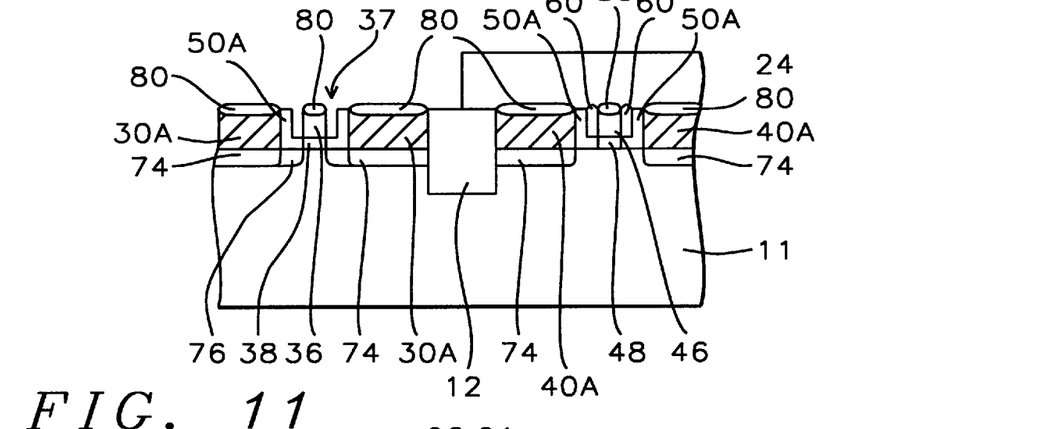

Referring to FIG. 11, the dielectric spacers (60) in the first area (1) are removed to form spacer openings (37). For devices such as CMOS, having a first area (1) and a second area (2) with opposite carrier types, a first implant mask (24) can be formed over the second area (2) prior to removing the dielectric spacers (60). The dielectric spacers (60) are preferably removed using an etch selective to the gate electrode (36) and the L-shaped spacers (50A) formed from the liner oxide layer (50). For example, dielectric spacers composed of silicon nitride can be removed using a reactive ion etch with $CHF_3/O_2$, $CH_2F_2$, or $CH_3F$.

In a key step, ions of a second conductivity type are implanted into the semiconductor substrate (11) in the first area (1) through the spacer openings (37) to form source and drain extensions (76). For a P-type transistor, the source and drain extensions (76) can be formed by implanting B or $BF_2$ ions at an energy of between about 3 KeV and 150 KeV and at a dose of between about 5E13 atm/cm$^2$ and 1E15 atm/cm$^2$. The impurity ions are then driven in at a temperature of between about 800° C. and 1150° C.

Figure 12:
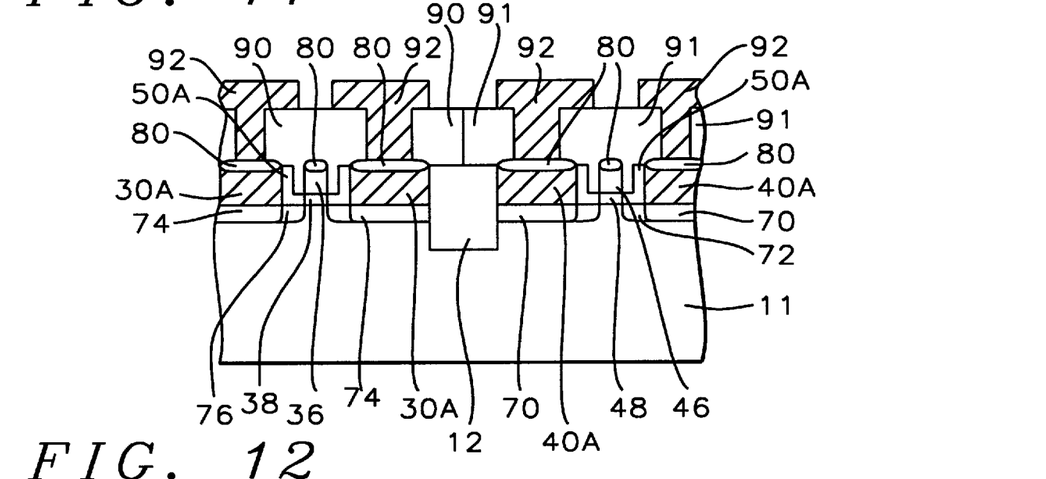

Referring to FIG. 12, a first interlevel dielectric layer (90) is formed over the first area (1) and in the spacer openings (37) in the first area (1). The first implant mask (not shown) is then removed.

For devices having a first area (1) and a second area (2) with opposite carrier types, a second implant mask (not shown) can be formed over the first area (1) and the dielectric spacers (60) can be removed in the second area (2) using the method described hereabove. Source and drain extensions (72) can be formed in the second area (2) by implanting As or P ions for NMOS and B or $BF_2$ ions for PMOS devices. The impurity ions are implanted at an energy of between about 3 KeV and 150 KeV and at a dose of between about 5E13 atm/cm$^2$ and 1E15 atm/cm$^2$. The impurity ions in the second area (2) can be driven in by annealing at a temperature of between about 800° C. and 1150° C. A second interlevel dielectric layer (91) can be formed over the second area (2) and in the spacer openings in the second area.

Still referring to FIG. 12, contact openings can be formed in the first interlevel dielectric layer and the second interlevel dielectric layer over the source and drain regions and filled with a conductive material to form contact plugs (90). The contact openings are prefereably formed by patterning using a photolithography process. The contact plugs can be formed as part of a first metal layer.

The key advantages of the present invention are that raised source and drain structures can be formed without using a SEG process, providing a more economical process. The present invention provides good control of the junction depth by implanting source and drain extensions through the spacer openings, while the liner oxide layer reduces impurity diffusion from the doped polysilicon structures. Also, the raised source and drain structures of the present invention are compatable with a self-aligned silicide process providing low contact resistance, and the use of CMP provides good co-planarity of the raised source and drain structures with the gate electrodes.

While the invention has been particularly shown and described with reference to the preferred embodiments thereof, it will be understood by those skilled in the art that various changes in form and details may be made without departing from the spirit and scope of the invention.

What is claimed is:

1. A method for forming a raised source and drain structure without using selective epitaxial silicon growth, comprising the steps of
    a. providing a semiconductor substrate having one or more dielectric structures thereon covering gate areas on said semiconductor substrate; said dielectric structures having first doped polysilicon structures adjacent thereto on each side, wherein said first doped polysilicon structres are doped with impurity ions having a first type;
    b. removing said dielectric structures to form gate openings having a bottom and sidewalls, and forming a liner oxide layer on said bottom, said sidewalls of said gate openings, and said first doped polysilicon structures;
    c. forming dielectric spacers on said liner oxide layer over said sidewalls of said gate openings, and removing said liner oxide layer from said bottom of said gate openings and from over said first doped polysilicon structures, wherein portions of the semiconductor substrate exposed;
    d. forming source and drain regions in said semiconductor substrate by diffusing impurity ions from said first doped polysilicon structures;
    e. forming a gate oxide layer and a gate polysilicon layer over said exposed portions of the semiconductor substrate and planarizing said gate polysilicon layer to form a gate electrode;
    f. removing said dielectric spacers to form spacer openings, implanting impurity ions of the same type as in the first doped polysilicon structures through said spacer openings, and annealing said semiconductor substrate to form source and drain extensions;
    g. reforming said dielectric spacers by forming a dielectric spacer layer in said spacer openings and planarizing said dielectric spacer layer stopping on said first doped polysilicon structures and on said gate electrode; and
    h. forming a self-aligned silicide layer on said first doped polysilicon structures and said gate electrode; said self-aligned silicide layer being composed of cobalt silicide.

2. The method of claim 1 wherein said source and drain extensions are formed by implanting B or $BF_2$ ions through said spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C.

3. The method of claim 1 wherein said source and drain extensions are formed by implanting As or P ions through said spacer openings at an energy of between about 3 KeV and 150 KeV and at a dose of between about 5E13 atm/cm$^2$ and 1E15 atm/cm$^2$, and driving in said As or P ions at a temperature of between about 800° C. and 1150° C.

4. The method of claim 1 wherein said liner oxide layer has a thickness of between about 100 Angstroms and 500 Angstroms and said gate oxide layer have a thickness of between about 10 Angstroms and 200 Angstroms.

5. The method of claim 1 wherein said dielectric spacers are composed of silicon nitride and have a thickness of between about 400 Angstroms and 2000 Angstroms.

6. The method of claim 2 wherein said first doped polysilicon structures have a concentration of B or $BF_2$ ions of between about 1E14 atm/cm$^3$ and 8E15 atm/cm$^3$ and said source and drain regions are formed by annealing said first doped polysilicon structures at a temperature of between about 800° C. and 1100° C. for a time of between about 5 seconds and 60 seconds.

7. The method of claim 3 wherein said first doped polysilicon structures have a concentration of As or P ions of between about 1E14 atm/cm$^3$ and 8E15 atm/cm$^3$ and said source and drain regions are formed by annealing said first doped polysilicon structures at a temperature of between about 800° C. and 1100° C. for a time of between about 5 seconds and 60 seconds.

8. The method of claim 1 wherein removing said liner oxide layer from said bottom of said gate openings and from over said first doped polysilicon structures in step c leaves an L-shaped oxide spacer on the sidewall of said gate openings.

9. A method for forming a raised source and drain structure without using selective epitaxial silicon growth, comprising the steps of:
    a. providing a semiconductor substrate having one or more dielectric structures thereon covering gate areas on said semiconductor substrate; said dielectric structures having first doped polysilicon structures adjacent thereto on each side, wherein said first doped polysilicon structures are doped with impurity ions having a first type;
    b. removing said dielectric structures to form gate openings having a bottom and sidewalls, and forming a liner oxide layer on said bottom, said sidewalls of said gate openings, and said first doped polysilicon structures;
    c. forming dielectric spacers on said liner oxide layer over said sidewalls of said gate openings, and removing said liner oxide layer from said bottom of said gate openings and from over said doped polysilicon structures, wherein portions of the semiconductor substrate are exposed;
    d. forming source and drain regions in said semiconductor substrate by diffusing impurity ions from said first doped polysilicon structures;

e. forming a gate oxide layer and a gate polysilicon layer over said exposed portions of the semiconductor substrate and planarizing said gate polysilicon layer to form a gate electrode;

f. forming a self-aligned silicide layer on said first doped polysilicon structures and said gate electrode;

g. removing said dielectric spacers to form spacer openings, implanting impurity ions having the same type as said first doped polysilicon structures through said spacer openings, and annealing said semiconductor substrate to form source and drain extensions; and h. reforming said dielectric spacers by depositing a dielectric spacer layer in said spacer openings and planarizing said dielectric spacer layer stopping on said first doped polysilicon structures and on said gate electrode.

10. The method of claim 9 wherein said source and drain extensions are formed by implanting B or $BF_2$ ions through said spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C.

11. The method of claim 9 wherein said source and drain extensions are formed by implanting As or P ions through said spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C.

12. The method of claim 9 wherein said liner oxide layer has a thickness of between about 100 Angstroms and 500 Angstroms and said gate oxide layer have a thickness of between about 10 Angstroms and 200 Angstroms.

13. The method of claim 9 wherein said dielectric spacers are composed of silicon nitride and have a thickness of between about 600 Angstroms and 2000 Angstroms.

14. The method of claim 10 wherein said first doped polysilicon structures have a concentration of B or $BF_2$ ions of between about 1E14 atm/cm$^3$ and 8E15 atm/cm$^3$ and said source and drain regions are formed by annealing said first doped polysilicon structures at a temperature of between about 800° C. and 1100° C. for a time of between about 5 seconds and 60 seconds.

15. The method of claim 11 wherein said first doped polysilicon structures have a concentration of As or P ions of between about 1E14 atm/cm$^3$ and 8E15 atm/cm$^3$ and said source and drain regions are formed by annealing said first doped polysilicon structures at a temperature of between about 800° C. and 1100° C. for a time of between about 5 seconds and 60 seconds.

16. The method of claim 9 wherein removing said liner oxide layer from said bottom of said gate openings and from over said first doped polysilicon structures in step c leaves an L-shaped oxide spacer on the sidewall of said gate openings.

17. A method for forming a raised source and drain structure without using selective epitaxial silicon growth, comprising the steps of a. providing a semiconductor substrate having a first area and a second area, wherein said first area has a well or a substrate of a first type and said second area has a well or a substrate of a second type, opposite said first type; said first area and said second area each having a gate area therein; said semiconductor substrate having an isolation structure thereon defining and separating said first area and said second area; said first area and said second area having a dielectric layer thereover;

b. patterning said dielectric layer to form dielectric structures which only overlie said gate areas of said semiconductor substrate;

c. forming a first nitride mask over said second area;

d. depositing a first doped polysilicon layer over said dielectric structures and said semiconductor substrate in said first area, and planarizing said first doped polysilicon layer to form first doped polysilicon structure, stopping on said dielectric structures; said first doped polysilicon layer being doped in-situ with impurity ions of said second type;

e. removing said first nitride mask and forming a second nitride mask over said first area;

f. depositing a second doped polysilicon layer over said dielectric structures and said semiconductor substrate in said second area, and planarizing said second doped polysilicon layer to form second doped polysilicon structure, stopping on said dielectric structures; said second doped polysilicon layer being doped in-situ with impurity ions having said first type;

g. removing said second nitride mask and forming a third nitride mask over said isolation structure;

h. removing said dielectric structures to form gate openings having a bottom and sidewalls, and removing said third nitride mask;

i. forming a liner oxide layer on said bottom, said sidewalls of said gate openings, and said first for verification and second doped polysilicon structures;

j. forming dielectric spacers on said liner oxide layer over said sidewalls of said gate openings;

k. removing said liner oxide layer from over the bottom of said gate openings and from over said first doped polysilicon structure and said second doped polysilicon structure, wherein portions of the semiconductor substrate are exposed;

l. forming gate oxide layers in said gate openings on said semiconductor substrate, forming a polysilicon layer over said gate oxide layers, and planarizing said polysilicon layer to form a first gate electrode in said first area and a second gate electrode in said second area;

m. forming source and drain regions by diffusing impurity ions from said first doped polysilicon structure into said semiconductor substrate in said first area and diffusing impurity ions from said second doped polysilicon structure into said semiconductor substrate in said second area;

n. forming a first implant mask over said second area, and removing said dielectric spacers in said first area to form first spacer openings;

o. implanting ions of said second type through said first spacer openings to form source and drain extensions;

p. reforming said dielectric spacers in said first area by depositing a dielectric spacer layer in said first spacer openings and planarizing said dielectric spacer layer stopping on said first doped polysilicon structure and on said first gate electrode;

q. removing said first implant mask and forming a second implant mask over said first area;

r. removing said dielectric spacers in said second area to form second spacer openings;

s. implanting impurity ions of said first type through said second spacer openings to form source and drain extensions;

t. reforming said dielectric spacers in said second area by depositing a dielectric spacer layer in said second spacer openings and planarizing said dielectric spacer layer stopping on said second doped polysilicon structure and on said second gate electrode;

u. annealing said semiconductor substrate to drive in said impurity ions in said source and drain extensions; and v. forming a self-aligned silicide layer on said first, second doped polysilicon structures and said first, second gate electrodes.

18. The method of claim 17 wherein said source and drain extensions in said first area are formed by implanting B or $BF_2$ ions through said first spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C. and said source and drain extensions in said second area are formed by implanting As or P ions through said second spacer openings at an energy of between about 3 KeV and 150 KeV and at a dose of between about 5E13 atm/cm$^2$ and 1E15 atm/cm$^2$, and driving in said As or P ions at a temperature of between about 800° C. and 1150° C.

19. The method of claim 17 wherein said source and drain extensions in said first area are formed by implanting As or P ions through said first spacer openings at an energy of between about 3 KeV and 150 KeV and at a dose of between about 5E13 atm/cm$^2$ and 1E15 atm/cm$^2$, and driving in said As or p ions at a temperature of between about 800° C. and 1150° C. and said source and drain extensions in said second area are formed by implanting B or $BF_2$ ions through second spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C.

20. The method of claim 17 wherein said liner oxide layer has a thickness of between about 100 Angstroms and 500 Angstroms and said gate oxide layers have a thickness of between about 10 Angstroms and 200 Angstroms.

21. The method of claim 17 wherein said dielectric spacers are composed of silicon nitride and have a thickness of between about 600 Angstroms and 2000 Angstroms.

22. The method of claim 18 wherein said first doped polysilicon structure have a concentration of B or $BF_2$ ions of between about 1E14 atm/cm$^3$ and 8E15 atm/cm$^3$, said second doped polysilicon structure have a concentration of As or P ions of between about 1E14 atm/cm$^3$ and 8E15 atm/cm$^3$, and said source and drain regions are formed by annealing said first doped polysilicon structure and said second doped polysilicon structure at a temperature of between about 800° C. and 1150° C. for a time of between about 5 seconds and 60 seconds.

23. The method of claim 19 wherein said first doped polysilicon structure have a concentration of As or P ions of between about 1E14 atm/cm$^3$ and 8E15 atm/cm$^3$, said second doped polysilicon structure have a concentration of B or $BF_2$ ions of between about 1E14 atm/cm$^3$ and 8E15 atm/cm$^3$, and said source and drain regions are formed by annealing said first doped polysilicon structure and said second doped polysilicon structure at a temperature of between about 800° C. and 1150° C. for a time of between about 5 seconds and 60 seconds.

24. A method for forming a raised source and drain structure without using selective epitaxial silicon growth, comprising the steps of:

a. providing a semiconductor substrate having a first area and a second area, wherein said first area has a well or a substrate of a first type and said second area has a well or a substrate of a second type, opposite said first type; said first area and said second area each having a gate area therein; said semiconductor substrate having an isolation structure thereon defining and separating said first area and said second area; said first area and said second area having a dielectric layer thereover;

b. patterning said dielectric layer to form dielectric structures which only overlie said gate areas of said semiconductor substrate;

c. forming a first nitride mask over said second area;

d. depositing a first doped polysilicon layer over said dielectric structures and said semiconductor substrate in said first area, and planarizing said first doped polysilicon layer to form first doped polysilicon structure, stopping on said dielectric structures; said first doped polysilicon layer being doped in-situ with impurity ions of said second type;

e. removing said first nitride mask and forming a second nitride mask over said first area;

f. depositing a second doped polysilicon layer over said dielectric structures and said semiconductor substrate in said second area, and planarizing said second doped polysilicon layer to form second doped polysilicon structure, stopping on said dielectric structures; said second doped polysilicon layer being doped in-situ with impurity ions having said first type;

g. removing said second nitride mask and forming a third nitride mask over said isolation structure;

h. removing said dielectric structures to form gate openings having a bottom and sidewalls, and removing said third nitride mask;

i. forming a liner oxide layer on said bottom, said sidewalls of said gate openings, and said first and second doped polysilicon structures;

j. forming dielectric spacers on said liner oxide layer over said sidewalls of said gate openings;

k. removing said liner oxide layer from over the bottom of said gate openings and from over said first doped polysilicon structure and said second doped polysilicon structure, wherein portions of the semiconductor substrate are exposed;

l. forming gate oxide layers in said gate openings on said semiconductor substrate, forming a polysilicon layer over said gate oxide layers, and planarizing said polysilicon layer to form a first gate electrode in said first area and a second gate electrode in said second area;

m. forming source and drain regions by diffusing impurity ions from said first doped polysilicon structure into said semiconductor substrate in said first area and diffusing impurity ions from said second doped polysilicon structure into said semiconductor substrate in said second area;

n. forming a self-aligned silicide layer on said first, second doped polysilicon structures and said first, second gate electrodes;

o. forming a first implant mask over said second area, and removing said dielectric spacers in said first area to form first spacer openings;

p. implanting ions of said second type through said first spacer openings to form source and drain extensions;

q. forming a first dielectric spacer layer in said first area filling said first spacer openings;

r. removing said first implant mask and forming a second implant mask over said first area;

s. removing said dielectric spacers in said second area to form second spacer openings;

t. implanting impurity ions of said first type through said second spacer openings to form source and drain extensions;

u. forming a second dielectric spacer layer in said second area filling said second spacer openings;

v. annealing said semiconductor substrate to drive in said impurity ions in said source and drain extensions.

w. planarizing said first dielectric spacer layer and said second dielectric spacer layer, and patterning said first dielectric spacer layer and said second dielectric spacer layer to form contact openings over said first doped polysilicon structure and said second doped polysilicon structure; and x. depositing a conductive material into said contact openings to form contact plugs.

25. The method of claim 24 wherein said source and drain extensions in said first area are formed by implanting B or $BF_2$ ions through said first spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C. and said source and drain extensions in said second area are formed by implanting As or P ions through said second spacer openings at an energy of between about 3 KeV and 150 KeV and at a dose of between about 5E13 atm/cm$^2$ and 1E15 atm/cm$^2$, and driving in said As or P ions at a temperature of between about 800° C. and 1150° C.

26. The method of claim 24 wherein said source and drain extensions in said first area are formed by implanting As or P ions through said first spacer openings at an energy of between about 3 KeV and 150 KeV and at a dose of between about 5E13 atm/cm$^2$ and 1E15 atm/cm$^2$, and driving in said As or p ions at a temperature of between about 800° C. and 1150° C. and said source and drain extensions in said second area are formed by implanting B or $BF_2$ ions through said second spacer openings at an energy of between about 3 KeV and 150 KeV and at a dose of between about 5E13 atm/cm$^2$ and 1E15 atm/cm$^2$, and driving in said B or $BF_2$ ions at a temperature of between about 800° C. and 1150° C.

27. The method of claim 24 wherein said liner oxide layer has a thickness of between about 100 Angstroms and 500 Angstroms and said gate oxide layers have a thickness of between about 10 Angstroms and 200 Angstroms.

28. The method of claim 24 wherein said dielectric spacers are composed of silicon nitride and have a thickness of between about 600 Angstroms and 2000 Angstroms.

29. The method of claim 25 wherein said first doped polysilicon structure have a concentration of B or $BF_2$ ions of between about 1E14 atm/cm$^3$ and 8E15 atm/cm$^3$, said second doped polysilicon structure have a concentration of As or P ions of between about 1E14 atm/cm$^3$ and 8E15 atm/cm$^3$, and said source and drain regions are formed by annealing said first doped polysilicon structure and said second doped polysilicon structure at a temperature of between about 800° C. and 1150° C. for a time of between about 5 seconds and 60 seconds.

30. The method of claim 26 wherein said first doped polysilicon structure have a concentration of As or P ions of between about 1E14 atm/cm$^3$ and 8E15 atm/cm$^3$, said second doped polysilicon structure have a concentration of B or $BF_2$ ions of between about 1E14 atm/cm$^3$ and 8E15 atm/cm$^3$, and said source and drain regions are formed by annealing said first doped polysilicon structure and said second doped polysilicon structure at a temperature of between about 800° C. and 1150° C. for a time of between about 5 seconds and 60 seconds.

* * * * *